United States Patent
Mashiko et al.

(10) Patent No.: US 6,994,621 B2
(45) Date of Patent: Feb. 7, 2006

(54) VENTILATION MEMBER, VENTED HOUSING USING THE SAME, PULL-OUT PREVENTION MEMBER FOR VENTILATION MEMBER AND KIT FOR FORMING VENTILATION STRUCTURE

(75) Inventors: Hiroaki Mashiko, Ibaraki (JP); Toshiki Yanagi, Ibaraki (JP); Hiroyuki Nishii, Ibaraki (JP); Yoshiki Ikeyama, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/437,972

(22) Filed: May 15, 2003

(65) Prior Publication Data
US 2003/0220067 A1    Nov. 27, 2003

(30) Foreign Application Priority Data
May 15, 2002 (JP) .............................. 2002-140628
Feb. 20, 2003 (JP) .............................. 2003-043209

(51) Int. Cl.
*B01D 19/00*   (2006.01)

(52) U.S. Cl. ........................... 454/270; 96/6; 362/345; 454/370

(58) Field of Classification Search ................... 95/46; 96/6; 454/254, 270, 271, 274, 275, 276, 454/370; 362/345, 547
See application file for complete search history.

(56) References Cited

U.S. PATENT DOCUMENTS

| | | | | |
|---|---|---|---|---|
| 5,038,794 A | * | 8/1991 | Van Valkenburg | 600/576 |
| 5,080,001 A | * | 1/1992 | Ishibashi et al. | 454/370 |
| 5,522,769 A | | 6/1996 | DeGuiseppi | |
| 5,829,936 A | * | 11/1998 | Omori et al. | 411/509 |
| 5,914,415 A | | 6/1999 | Tago | |
| 6,017,060 A | * | 1/2000 | Wilson et al. | 280/806 |
| 6,364,924 B1 | | 4/2002 | Mashiko et al. | |

FOREIGN PATENT DOCUMENTS

| | | |
|---|---|---|
| JP | 10-85536 A | 4/1998 |
| JP | 2001-143524 A | 5/2001 |

* cited by examiner

Primary Examiner—Harold Joyce
(74) Attorney, Agent, or Firm—Sughrue Mion, PLLC

(57) ABSTRACT

A ventilation member having: a breathable film transmitting gas passing through an opening portion of a housing in a state in which the breathable film is fixed to the opening portion; and a support including a supporting portion for supporting the breathable film and an insertion portion to be inserted into the opening portion of the housing; wherein the insertion portion has a lock portion in an insertion-start-side end portion thereof, the lock portion having a tapered forward end, while the insertion portion is divided into a plurality of parts circumferentially at least on an insertion start side thereof.

12 Claims, 16 Drawing Sheets

VENTILATION MEMBER, VENTED HOUSING USING THE SAME, PULL-OUT PREVENTION MEMBER FOR VENTILATION MEMBER AND KIT FOR FORMING VENTILATION STRUCTURE

The present application is based on Japanese Patent Applications Nos. 2002-140628 and 2003-43209, the entire contents of which are incorporated herein by reference.

BACKGROUND OF THE INVENTION

1. Field of the Invention

The present invention relates to a ventilation member fixed to a housing for automobile electrical components or the like, and the housing to which the ventilation member is fixed.

2. Related Art

Ventilation members are attached to various housings of automobile electrical components such as ECUs (Electronic Control Units), lamps, motors, various sensors, pressure switches and actuators; cellular phones; cameras; electric shavers; electric toothbrushes; and lamps for outdoor use.

Each of the ventilation members prevents water or dust from invading the inside of a housing while playing various roles in accordance with the kind of housing to which the ventilation member is attached. The roles include propagation of voice, discharge of gas generated inside the housing, and relaxation of a change of pressure inside the housing caused by a change of temperature.

FIGS. 17A and 17B show an example of a related-art ventilation member. A ventilation member 51 shown in each of FIGS. 17A and 17B is used for an equipment housing to be exposed to contaminants such as rain, muddy water or oils, for example, for automobile electric components. The ventilation member 51 has an L-shaped or U-shaped (not shown) tubular body. The ventilation member 51 may have a structure having a maze 52 internally. One end of the ventilation member 51 is outer-fitted to a neck portion 50a provided in a housing 50 so that the ventilation member 51 is fixed to the housing.

FIGS. 18A and 18B show another example of a related-art ventilation member. In a ventilation member 60 shown in FIGS. 18A and 18B, a substantially cylindrical body 62 is fitted to the inside of a cover part 61 so as to form a ventilation path between the inner circumference of the cover part 61 and the outer circumference of the substantially cylindrical body 62 and between the bottom surface of the cover part 61 and the bottom portion of the substantially cylindrical body 62. When an opening in the bottom portion of the substantially cylindrical body 62 is covered with a filter 63, the ventilation member 60 can also exert a higher water-proofing property and a higher dust-proofing property (disclosed in Japanese Patent Publication No. JP-A-2001-143524). An opening 62a in the top portion of the substantially cylindrical body 62 is outer-fitted to the neck portion 50a of the housing 50 so that the ventilation member 60 is fixed to the housing.

FIG. 19 shows another example of a related-art ventilation member. In a ventilation member 70 shown in FIG. 19, a tapered insertion portion 71a is formed in one end portion of a disc-like elastomer member 71, while a splash guard cover 71b is formed on the other end portion of the disc-like elastomer member 71, and a breathable film 72 is fixed by fusion bonding on the way of a ventilation flow path penetrating between the one end portion and the outer circumference of the other end portion. In addition, a sealing/fixing portion 71c for fixedly retaining a housing 7 in cooperation with the insertion portion 71a is formed in the outer circumference of the elastomer member 71 (disclosed in Japanese Patent Publication No. JP-A-H10-85536). The insertion portion 71a is pressed into the opening portion of the housing so that the ventilation member 70 is fixed to the housing.

However, the ventilation members have the following problems.

Each of the ventilation members 51 and 60 shown in FIGS. 17A, 17B, 18A and 18B is fixed to the housing 50 only by outer fitting to the neck portion 50a of the housing 50. Therefore, there is a possibility that the ventilation member may be pulled out of the housing.

On the other hand, in the ventilation member 70 shown in FIG. 19, the surface abutting against the housing 7 is made of elastomer. Therefore, when oil invades a part of the surface of the ventilation member 70 abutting against the housing 7, it becomes easy to detach the ventilation member 70 from the housing. It cannot be therefore said that the ventilation member 70 is suitable as a ventilation member for a housing used in an environment easy for oil to adhere to the ventilation member.

SUMMARY OF THE INVENTION

According to the invention, there is provided a ventilation member having: a breathable film transmitting gas passing through an opening portion of a housing in a state in which the breathable film is fixed to the opening portion; and a support including a supporting portion for supporting the breathable film and an insertion portion to be inserted into the opening portion of the housing; wherein the insertion portion has a lock portion in an insertion-start-side end portion thereof, the lock portion having a tapered forward end, while the insertion portion is divided into a plurality of parts circumferentially at least on an insertion start side thereof.

The ventilation housing of the invention is characterized in that the ventilation member is fixed to the opening portion of the housing.

According to the invention, there is provided a pull-out prevention member for ventilation member which is served along with the ventilation member of the invention, characterized in that: the pull-out prevention member includes a columnar portion which is inserted into the insertion portion inserted into the opening portion so as to penetrate the opening portion, so that the insertion portion is spread from the inside thereof, and on the columnar portion, there is formed an air hole communicating with the through hole of the ventilation member when the pull-out prevention member is inserted into the insertion portion.

According to the invention, there is provided a kit for forming a ventilation structure comprising the ventilation member of the invention and the pull-out prevention member for ventilation member of the invention.

BRIEF DESCRIPTION OF THE DRAWINGS

FIG. 8B is a view in which the seal portion is omitted from the bottom view of the ventilation member shown in FIG. 9A;

DETAILED DESCRIPTION OF THE PREFERRED EMBODIMENTS

Preferred embodiments of the invention will be described with reference to the drawings.

(First Embodiment)

Description will be made on an embodiment of a ventilation member according to the invention with reference to FIGS. 1 through 6B.

Figure 1:
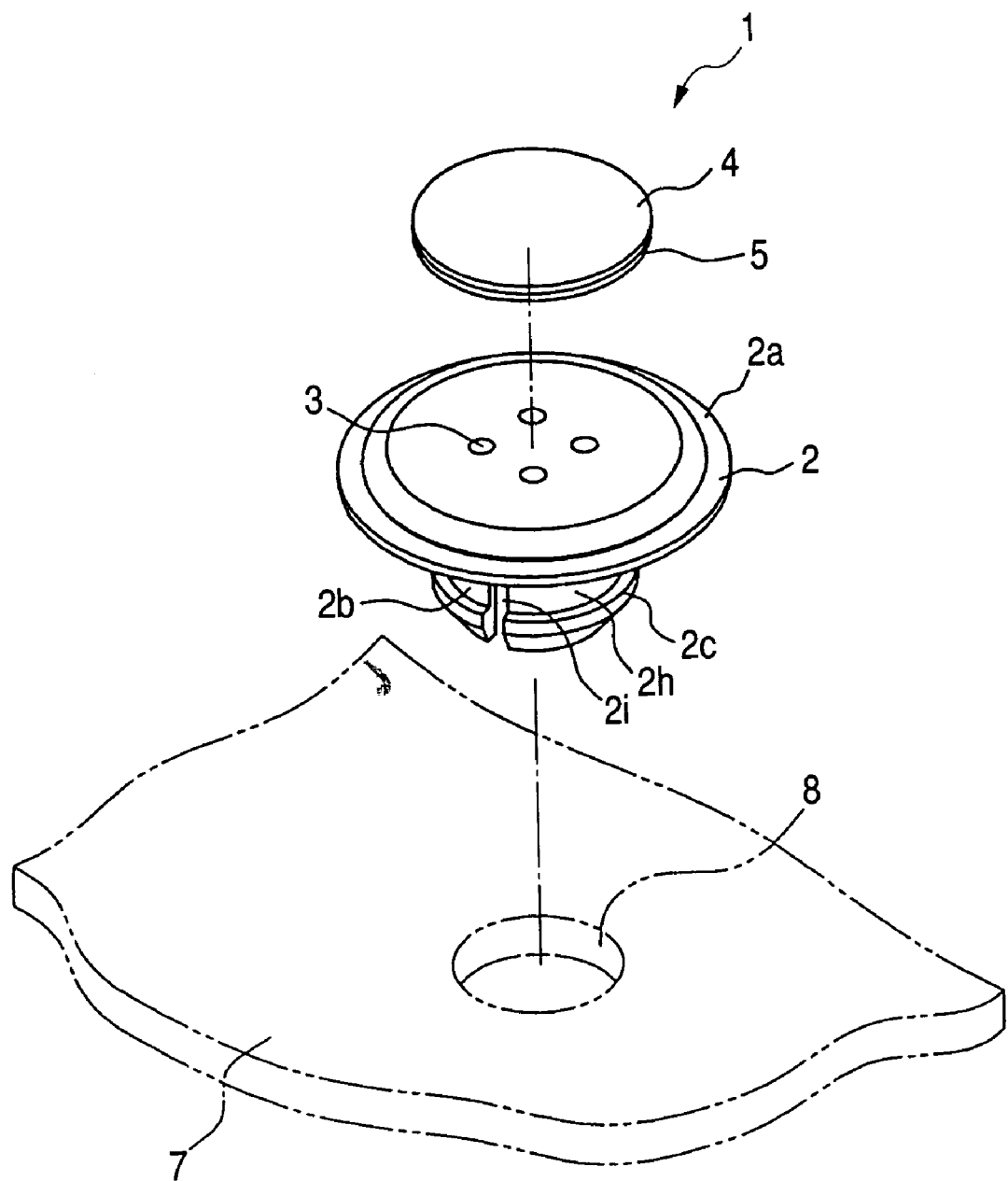
FIG. 1 is an exploded view showing an embodiment of a ventilation member according to the invention.
Figure 2A:
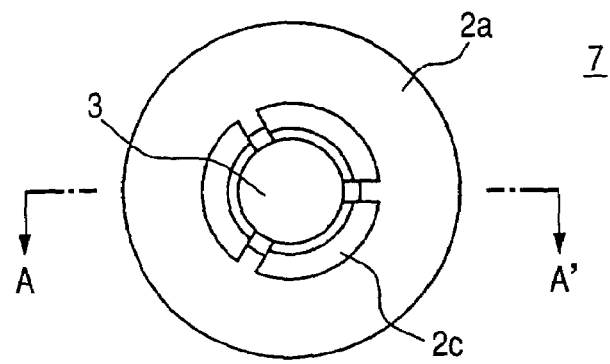
FIG. 2A is a bottom view of the ventilation member shown in FIG. 1.
Figure 2B:
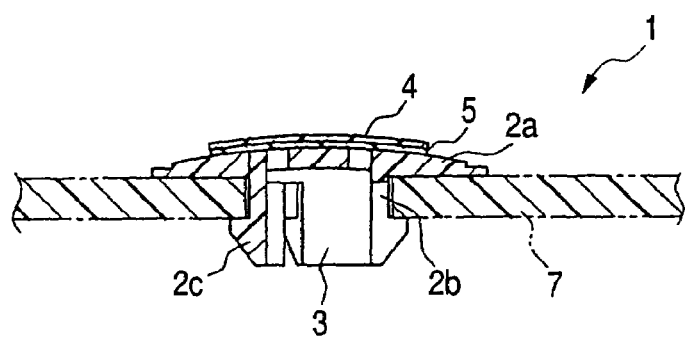
FIG. 2B is a sectional view taken on line A–A' in FIG. 2A.

A ventilation member 1 shown in FIGS. 1, 2A and 2B includes a support 2 and a breathable film 4. The support 2 includes a supporting portion 2a for supporting the breathable film 4, and an insertion portion 2b formed on one side of the supporting portion 2a. Through holes 3 penetrating the supporting portion 2a and the insertion portion 2b are formed in a central portion of the support 2. The breathable film 4 is fixedly attached to the supporting portion 2a so as to cover the through holes 3.

The insertion portion 2b has a columnar shape whose diameter is substantially the same as that of an opening portion 8 of a housing 7. At least the insertion start side of the insertion portion 2b is divided into a plurality of parts circumferentially. The insertion portion 2b includes at least a plurality of leg portions 2h provided on the insertion start side so as to form a slit 2i between the adjacent leg portions 2h. Each of the leg portions 2h includes a lock portion 2c whose outer peripheral face is tapered at an end on the insertion start side.

When the ventilation member 1 is fixed to the opening portion 8 of the housing 7, the lock portions 2c are pressed onto the opening portion 8 by inserting the insertion portion 2b into the opening portion, so that the divided parts of the insertion portion 2b (leg portion 2h) are bent inward. Thus, the insertion pressure of the ventilation member 1 against the housing 7 is reduced. When the lock portions 2c pass through the opening portion 8 and is released from the pressure, the lock portions 2c are locked on the inner surface of the housing. Thus, the ventilation member 1 is fixed to the housing 7. Once the ventilation member 1 is fixed to the housing 7, the ventilation member 1 cannot be took off from the outside of the housing 7 unless the ventilation member 1 is pulled out with force great enough to break the ventilation member 1 and/or the housing 7. Thus, the possibility that the ventilation member 1 is detached from the housing 7 is reduced.

In the embodiment shown in FIGS. 1, 2A and 2B, the insertion start side of the insertion portion 2b is divided into three circumferentially. The number of divided parts is not limited thereto, but may be two or four, or more. In addition, in the embodiment shown in FIGS. 1, 2A and 2B, a longitudinal part of the insertion portion 2b is divided into a plurality of parts. The invention is not limited thereto, but the whole of the insertion portion 2b may be divided longitudinally into a plurality of parts. Although all the leg portions 2h include the lock portion 2c in this embodiment, the lock portions may be provided on at least one, preferably two or more leg portions 2h. It is preferable to form the lock portions 2c more than 0.1 mm apart from the tip end of the insertion portion 2b on the insertion start side. If a flat portion is formed at the end of the insertion start side, the insertion portion 2b can be easily inserted in the opening portion 8 of the housing.

The shape of the supporting portion 2a is not limited particularly, but may be like a disc having a larger diameter than that of the insertion portion 2b, as shown in FIGS. 1, 2A and 2B. The supporting portion 2a may have a larger diameter than that of the opening portion 8 formed in the housing 7 so as to be disposed to cover the opening portion 8.

In addition, the surface of the supporting portion 2a abutting against the breathable film 4 is formed into a curved surface as shown in FIG. 2B. In such a manner, the ventilation member in which the curved surface having a circumferential edge portion lower in height than a central portion at a surface of the supporting portion 2a is provided, the property of water drainage is improved suitably as a property of a ventilation member for a housing for use in an environment easy to be affected by water. Incidentally, in place of the curved surface of the supporting portion 2a as described above, for example, the shape of the supporting portion 2a maybe formed into a conical shape. In this case, the breathable film 4 is fixedly attached to the slope of the conical shape so that the property of water drainage can be improved.

The dimensions of the through holes 3 may be determined appropriately in consideration of the kind of housing to which the ventilation member 1 is fixed and the permeability of the breathable film 4. The area of the through holes 3 (area on a plane perpendicular to the gas permeable direction) may be set to be 0.001–100 cm².

In addition, a plurality of through holes 3 are provided in the surface covered with the breathable film 4 as shown in FIG. 2B. When a plurality of through holes 3 are formed in the surface covered with the breathable film 4 in such a manner, the center of the breathable film 4 is also supported by the supporting portion 2a. It is therefore possible to suppress the damage of the breathable film 4 from external force.

Figure 3:
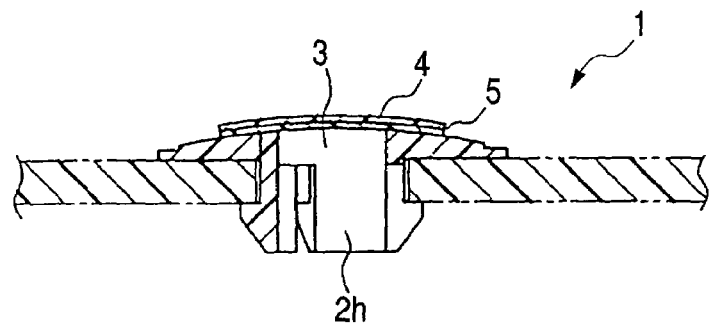
FIG. 3 is a sectional view showing another embodiment of a ventilation member according to the invention.

As shown in FIG. 3, a single through hole 3 may be formed on the face that is to be covered with the breathable film 4. If the diameter of the through hole 3 is large, air permeability is enhanced. Further, if the diameter is sufficiently large, and is constant in a longitudinal direction of the through hole 3, the moisture condensation which would inhibit air breathing is prevented on the wall of the supporting member 2 surrounding the through hole. However, if the through hole is large, it is a fear that the leg portions 2h of the ventilation members would break the breathable films 4 when the plurality of the ventilation members are packed in a single pack and transported or delivered.

Figure 4A:
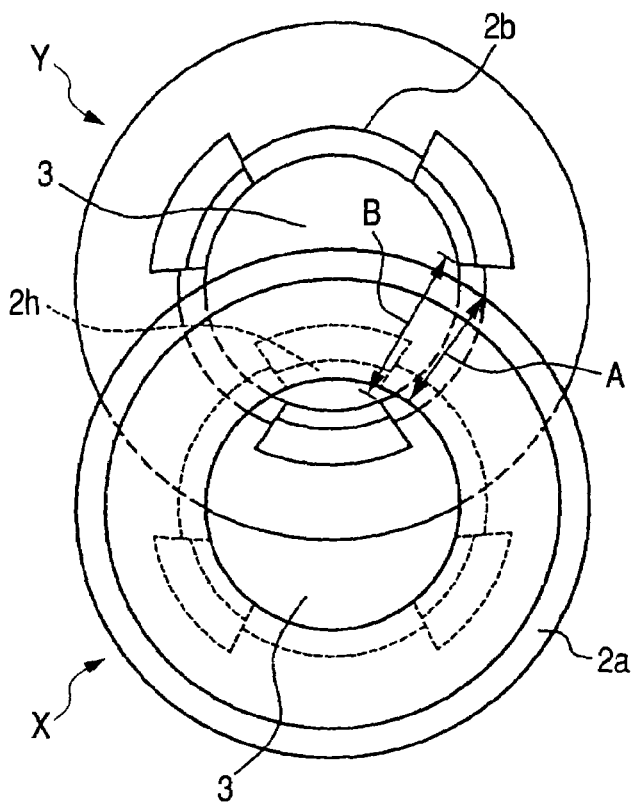
FIGS. 4A and 4B are views showing a state where one of the leg portions 2h of one ventilation member is inserted into the through hole 3 of the other ventilation member.
Figure 4B:
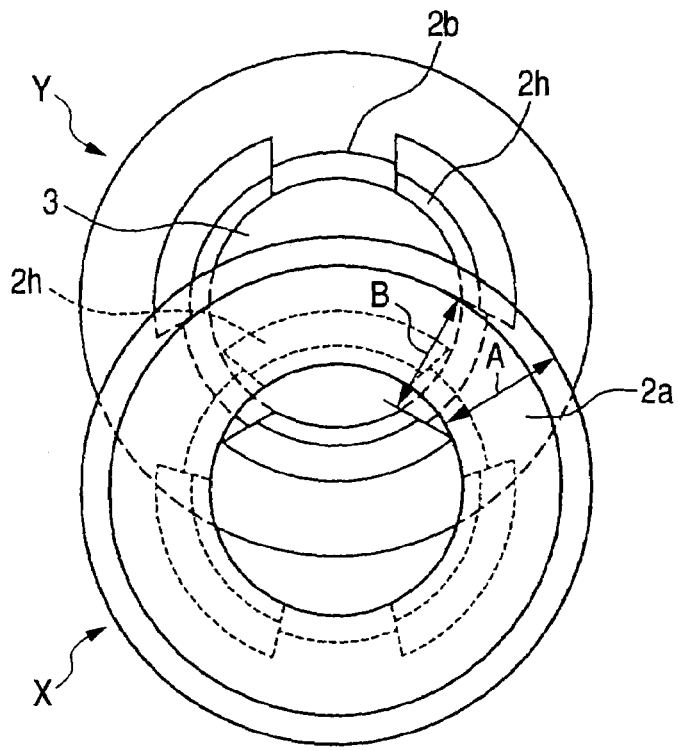

FIGS. 4A and 4B show the leg portion 2h of the ventilation member x is inserted in the through hole 3 of the other ventilation member Y. FIGS. 4A and 4B are plan views as viewed in a direction in which air passes through. The ventilation member X is viewed from a side of the supporting portion 2a, and the ventilation member Y is viewed from a side of the insertion portion 2b, respectively. The breathable film of the ventilation member X is omitted in the figures. The support (corresponding to the supporting portion 2a in FIGS. 4A and 4B) shows a ring shape in a plan view in the direction in which the air passes through.

As shown in FIG. 4A, if a dimension A is smaller than a dimension B, the leg portion 2h of the ventilation member X can be deeply inserted into the through hole 3 of the ventilation member Y so that the breathable film of the ventilation member Y is broken. The dimension A is defined as the minimum value of the ring width (minimum ring width) and the dimension B is defined as the closest distance between two of the adjacent leg portions in which the closest distance therebetween is the largest than any other pairs of adjacent leg portions (maximum distance between the leg portions) at the ends of the insertion start side of the insertion portions 2b.

As shown in the plan view of FIG. 4A in the direction in which the air passes through, if the outer shape of the supporting portion 2a and the through hole 3 are true circles and the circles are concentric, the ring width at any portion is constant. Therefore this value is determined to the dimension A. Further, as shown in FIG. 4A, the leg portions 2h have the same shape and are disposed at a constant interval, the closest distance between any two adjacent leg portions among the leg portions 2h at the ends of the insertion start side of the insertion portions 2b is the same, therefore, this value is determined to be the dimension B.

As shown in FIG. 4B, when the dimension A is provided to be larger than the dimension B, even if the leg portions 2h of the ventilation member X come to enter deeply into the through hole 3 of the ventilation member Y, the supporting portion 2a of the ventilation member X abuts with the leg portions 2h of the ventilation member Y so that the leg portions 2h of the ventilation member X are prevented from being inserted into the through hole 3 of the ventilation member Y. Accordingly, breakage of the breathable films 4 of the other ventilation members by the leg portions 2h and interlacement of the leg portions 2h with those of the other ventilation members are prevented. Handling of the ventilation members are easily performed.

Thermo plastic resin easy to mold is preferably used as the material of the support 2 without any particular limitation. Examples of such a material to be used include thermoplastic resins other than elastomers, such as polybutylene terephthalate (PBT), polyethylene terephthalate (PET), polyphenylene sulfide (PPS), polysulfone (PS), polypropylene (PP), polyethylene (PE), ABS resin, or composite materials of these thermoplastic resins. Other than the thermoplastic resins, composite materials in which reinforcement materials such as glass fibers or carbon fibers, or metal is compounded with thermoplastic resin so as to improve the heat resistance, the moisture resistance, the dimensional stability and the rigidity may be used. In addition, the ventilation member 1 is fixed to the housing by press fitting. It is therefore preferable to use a material superior in impact resistance and high in bending strength, such as PBT, PPS or PS. Particularly, when PBT is used, it is preferable that 5 to 40 wt % of the glass fibers are contained in the material. Further, treatments for obtaining desired characteristics such as mold release, adhesiveness improvement, electrical insulation, semiconductivity, conductivity or the like may be performed on the surface of the support 2 which is formed with the above-mentioned materials.

The method for forming the support 2 is not limited particularly. For example, the support 2 may be formed by injection molding, compression molding or cutting.

The material, structure and form of the breathable film 4 are not limited particularly if sufficient permeability can be secured. It is, however, preferable to select at least one kind from fluororesin porous materials and polyolefin porous materials. Examples of fluororesins include polytetrafluoroethylene (PTFE), polychlorotrifluoroethylene, tetrafluoroethylene-hexafluoropropylene copolymer, tetrafluoroethylene-perfluoroalkylvinylethercopolymer, and tetrafluoroethylene-ethylene copolymer. Examples of polyolefin monomers include ethylene, propylene, 4-methylpentene-1, and 1-butene. Polyolefins obtained by simply polymerizing or copolymerizing these monomers may be used. In addition, two or more kinds of such polyolefins may be blended, or laminated in layers. Of these, PTFE porous material is particularly preferred because it can keep permeability even in a small area and has a high function of preventing water or dust from invading the inside of the housing.

As shown in FIG. 1 through FIG. 3, are in for cement material 5 may be laminated to the breathable film 4. When the reinforcement material 5 is laminated to one side of the breathable film 4 in such a manner, the reinforcement material 5 may be laminated to a surface opposite to the surface on which the reinforcement material 5 of the breathable film 4 is laminated as shown in FIGS. 1 through 3. The material, structure and form of the reinforcement material 5 are not limited particularly. It is, however, preferable to use a material having a pore size larger than that of the breathable film 4 and superior in gas permeability, such as woven fabric, nonwoven fabric, mesh, net, sponge, foam, metal porous material, or metal mesh. When heat resistance is required, it is preferable to use a reinforcement material made of polyester, polyamide, aramid resin, polyimide, fluororesin, ultra high molecular weight polyethylene, or metal. Incidentally, although the reinforcement material 5 is laminated to one side of the breathable film 4 in the embodiment shown in FIGS. 1 through 3, the reinforcement material 5 may be laminated to the both sides of the breathable film 4. The breathable films 4 may be laminated on both sides of the reinforcement material 5.

As for the method for laminating the reinforcement material 5 to the breathable film 4, they may be put on top of each other simply, or joined to each other. For example, the joining may be performed in a method of adhesive lamination, thermal lamination, heating deposition, ultrasonic deposition, or bonding with a bonding agent. For example, when the breathable film 4 and the reinforcement material 5 are laminated by thermal lamination, a part of the reinforcement material 5 may be heated and melted to be bonded to the breathable film 4. Thus, the breathable films 4 are bonded to the reinforcement material 5 without using adhesive, unnecessary weight increase and degradation in the air permeability can be avoided. Alternatively, the breathable film 4 and the reinforcement material 5 may be bonded with a fusion bonding agent such as hot melt powder.

Air permeability (Gurley value) of a laminate laminated with the breathable film 4 and the reinforcement material 5 is preferably in a rage of 0.1–300 sec/100 cm$^3$, more preferably in a range of 1.0–100 sec/100 cm$^3$. The water resistant pressure is preferably not less than 1.0 kPa.

Liquid-repellent treatment such as water-repellent treatment or oil-repellent treatment may be given to the breathable film 4 in accordance with the application of the housing. The liquid-repellent treatment can be carried out by applying the breathable film 4 with a substance having a small surface tension, drying the substance and then curing the substance. The liquid-repellent agent is not limited particularly so long as a coat lower in surface tension than the breathable film can be formed as the liquid-repellent agent. It is, however, preferable to use polymer having a perfluoro alkyl group. Examples of such polymers for use include Fluorad (made by Sumitomo 3M Ltd.), Scotchguard (made by Sumitomo 3M Ltd.), Texguard (made by Daikin Industries, Ltd.), Unidyne (made by Daikin Industries, Ltd.), and Asahi Guard (made by Asahi Glass Co., Ltd.) (all under trade names). The liquid-repellent agent may be applied by impregnation or spraying.

As for the method for supporting the breathable film 4 on the supporting portion 2a, a method of heating deposition, ultrasonic deposition or bonding using a bonding agent is suitable because peeling or floating hardly occurs. From the point of view of handiness, heating deposition or ultrasonic deposition is preferred. When the reinforcement material 5 is laminated to the breathable film 4, any supporting method may be employed without particular limitation as long as the reinforcement material 5 can be fixedly attached to the support 2. Incidentally, when a high liquid-repellent property is required, preferably, the reinforcement material 5 is fixedly attached to the supporting portion 2a while the surface higher in liquid-repellent property faces the outside of the housing.

As another method for supporting the breathable film 4 on the supporting portion 2a, the breathable film 4 may be disposed in a mold for forming the support 2 when the support 2 is injection-molded. In this case, the breathable film 4 is integrated with the support 2.

A thickness of the breathable film 4 or, the laminate member laminated the breathable film 4 and the reinforcement material 5 is preferably set in a range between 1 μm and 5 mm. If the film is thinner than 1 μm, the film is easily broken, and if the film is thicker than 5 mm, it is difficult to support the film on the supporting portion.

Figure 5:
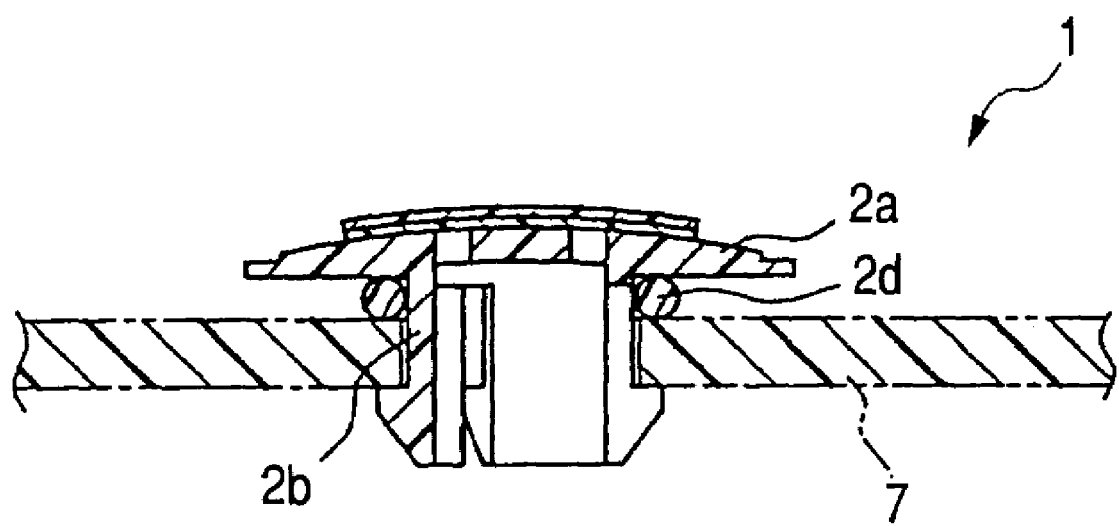
FIG. 5 is a sectional view showing another embodiment of a ventilation member according to the invention.

In addition, when a seal portion 2d is provided on the surface of the supporting portion 2a facing the housing as shown in FIG. 5, the adhesion or air tightness between the housing 7 and the ventilation member 1 can be enhanced. Particularly, when thermoplastic resin other than elastomer is used for the supporting portion 2a, it is preferable to form the seal portion 2d so as to enhance the sealing performance.

Examples of preferred materials for the seal portion include elastomers such as nitrile-butadiene rubber (NBR), ethylene-propylene rubber (EPM or EPDM), silicone rubber, fluoric rubber, acrylic rubber, hydro-nitrile-butadiene rubber (HNBR), foamed materials, or formed materials with adhesive layers.

For example, the seal portion 2d may be provided by outer fitting an O-ring of the above-mentioned material to the insertion portion 2b, or may be formed on one side of the supporting portion 2a by dichromatic molding. Further, the formed materials having adhesive layers may be pasted on a surface opposite to the housing 7 of the supporting portion 2a.

Figure 6A:
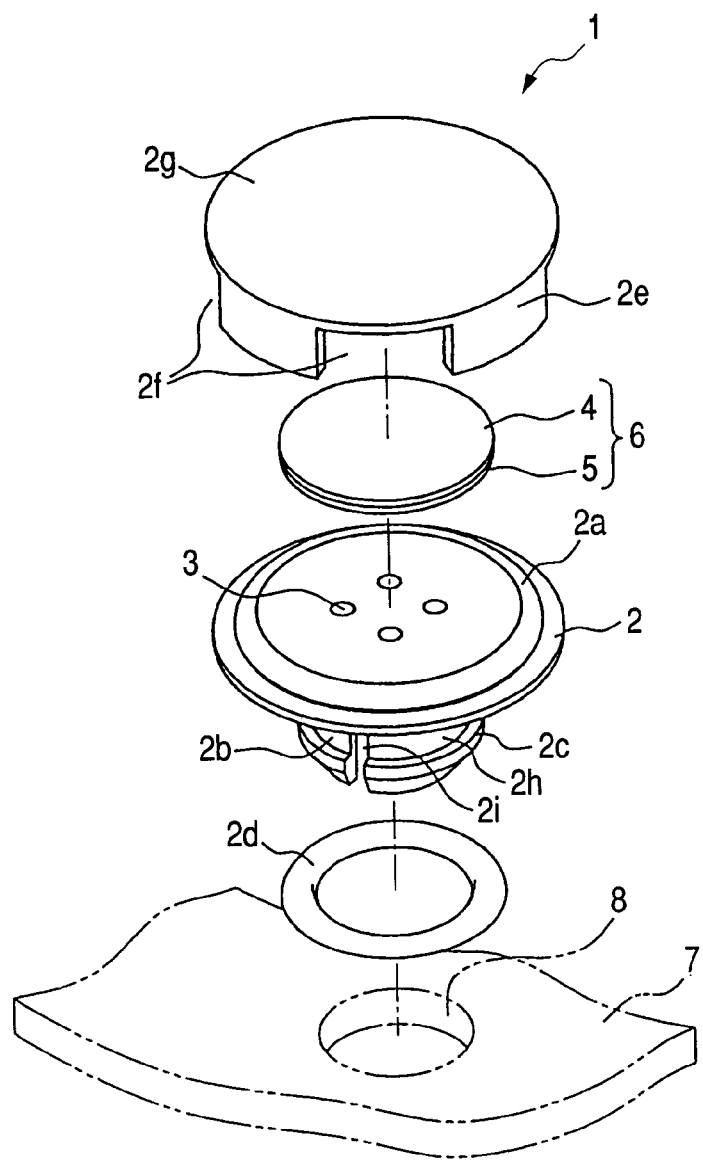
FIG. 6A is an exploded view showing another embodiment of a ventilation member according to the invention.
Figure 6B:
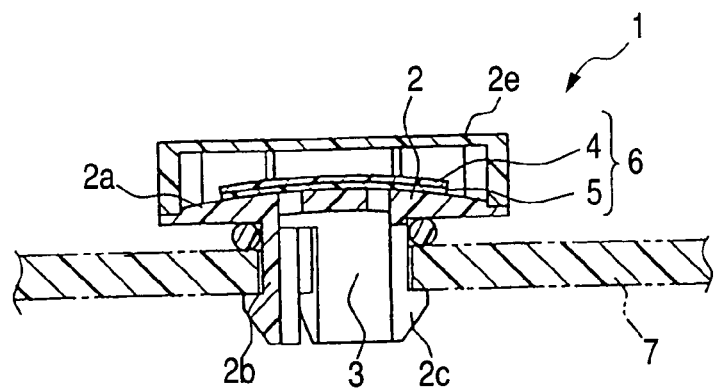
FIG. 6B is a sectional view of the ventilation member shown in FIG. 6A.

In addition, when the support 2 has a protective portion 2e covering at least a part of the breathable film 4 from above of the breathable film 4 as shown in FIGS. 6A and 6B, it is possible to reduce the possibility that the breathable film 4 is damaged by external force or the ventilation is blocked by sand or mud accumulated on the surface of the breathable film.

The shape of the protective portion 2e is not limited particularly as long as it is a shape not spoiling the permeability of the ventilation member 1. It is, however, preferable that a plurality of opening portions 2f are formed in positions where they cannot be viewed when observed in the gas permeable direction, for example, in the side surface of the protective portion 2e as in the embodiment shown in FIGS. 6A and 6B. Incidentally, opening portions 2f maybe also formed in an upper surface 2g of the protective portion 2e as long as the opening portions 2f do not spoil the effect of protecting the breathable film 4. In addition, it is preferable that the opening portions 2f are formed as divided small holes from the point of view of keeping the strength of the protective portion 2e and effectively preventing invasion of matters.

As the material of the protective portion 2e, a material similar to that of the other portion of the support 2 may be used. The method for integrating the protective portion 2e with the other portion of the support 2 is not limited particularly. The integration may be attained in a method of heating deposition, ultrasonic deposition, vibration deposition, bonding using a bonding agent, fitting, or screwing. Particularly, heating deposition or ultrasonic deposition is preferred because of its low cost and easiness.

(Second Embodiment)

Figure 7:
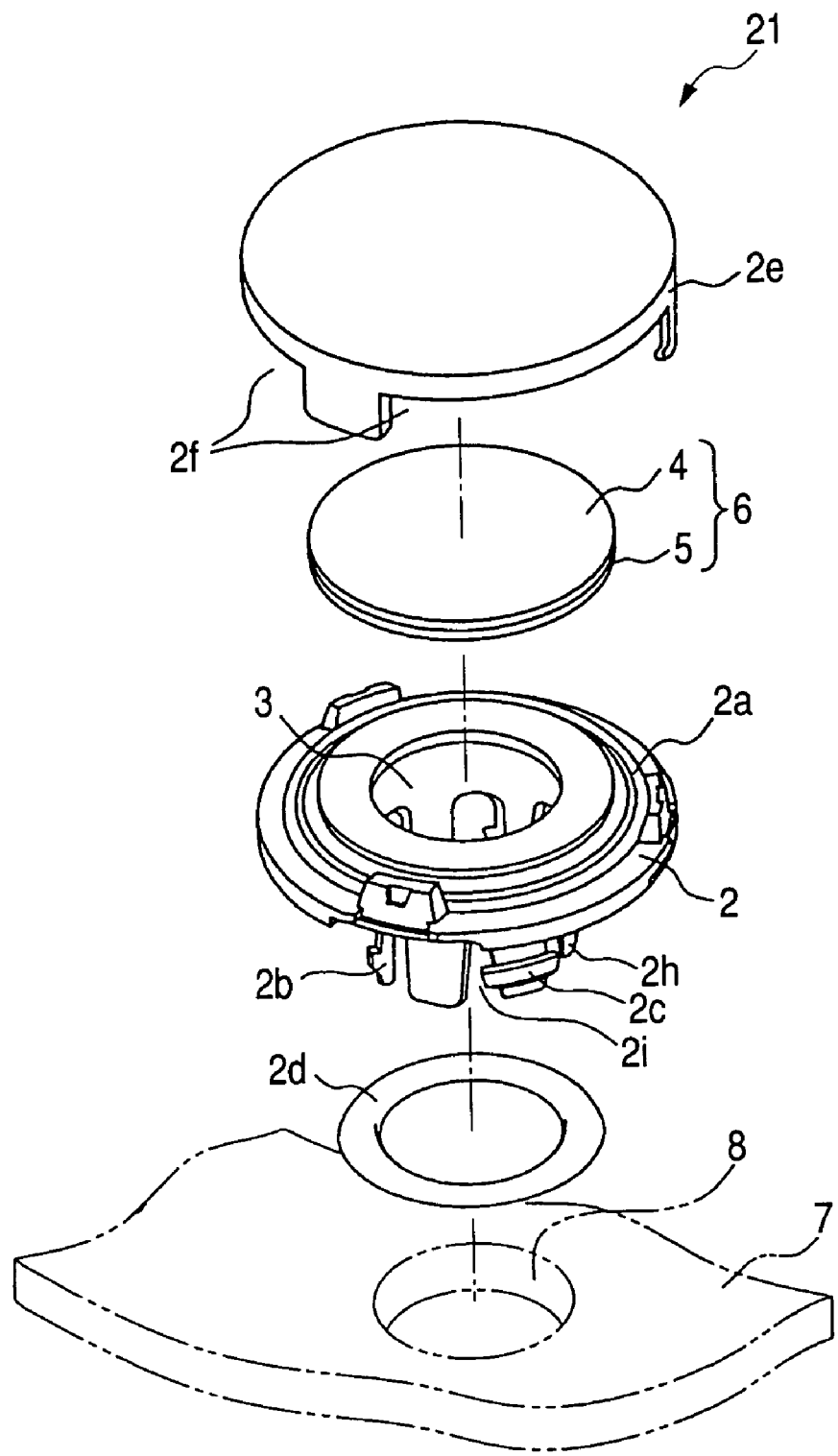
FIG. 7 is a sectional view showing another embodiment of a ventilation member according to the invention.
Figure 8A:
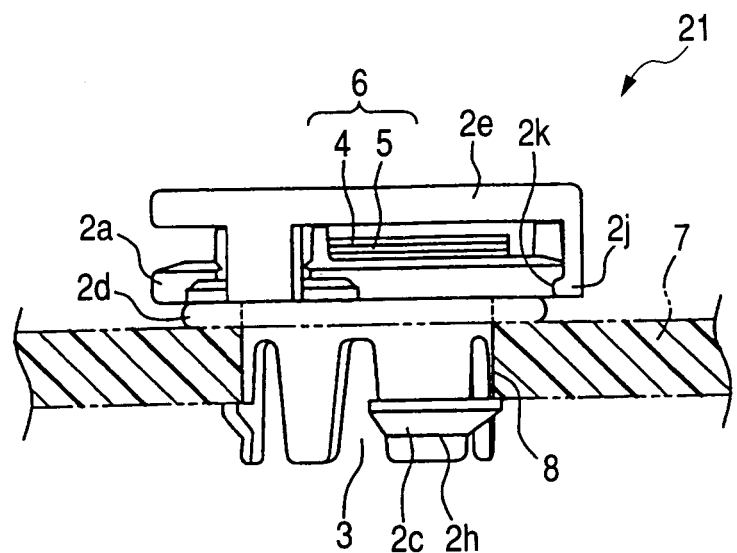
FIG. 8A is a front view of the ventilation member shown in FIG. 7.
Figure 8B:
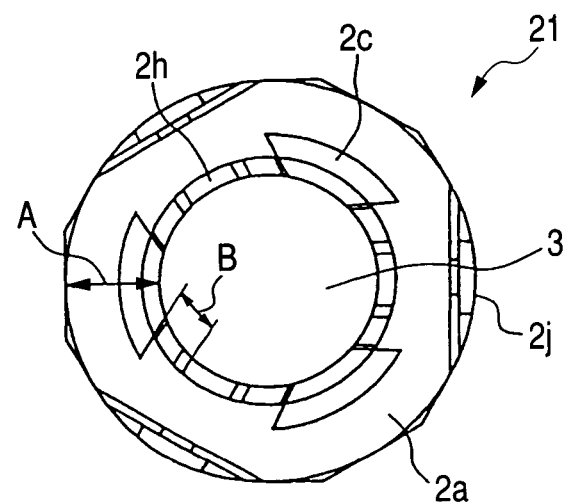
FIG. 8B is a view in which the seal portion is omitted from the bottom view of the ventilation member shown in FIG. 8A.

In this embodiment, the other ventilation member of the invention is described by accompanying FIGS. 7, 8A and 8B. Unless specific explanation is provided, this embodiment is configured similarly to the previous embodiment, like elements are given like reference numerals so that the explanations are omitted.

While the ventilation member shown in FIGS. 1, 2A and 2B is provided with the insertion portion 2b which is divided into three parts along a circumferential direction thereof and each of these three leg portions 2h includes the lock portion 2c at the end of the insertion start side (See FIG. 2B), the ventilation member 21 of this embodiment has the insertion portion 2b which is divided into six parts along the circumferential direction of thereof. Among these six leg portions 2h, three of the leg portions 2h include the lock portion 2c. The leg portions 2h which include the lock portions 2c and the leg portions. 2h which do not include the lock portions 2c are alternately disposed in the circumferential direction.

As shown in the ventilation member of FIGS. 1, 2A and 2B, in a case that each of the leg portions 2h includes the lock portion 2c, for reducing the insertion pressure of the insertion portion 2b into the opening portion 8, it is proposed to make the width of the leg portion 2h smaller (namely, the slit 2i becomes wider) so that the leg portions 2h are easily bent inwardly, or it is proposed to make a sliding contact area of the lock portion 2c to the opening portion 8 smaller (See FIG. 1). However, if the width of the leg portions 2h becomes smaller, the insertion portion 2b can be easily rotated in the opening portion 8 since the contact area between the insertion portion 2b and the opening portion 8 is reduced. Therefore the stability is decreased.

In the ventilation member 21 of this embodiment, as the insertion portion 2b is divided into more parts in the circumferential direction, and include leg portions 2h which do not have the lock portions 2c, the leg portions 2h can be easily bent inwardly and the sliding contact area between the lock portions 2c and the opening portion 8 is decreased so that the insertion pressure is decreased. Further, the contact area of the insertion portion 2b with the opening portion 8 is reserved so that the positional shift after insertion is inhibited thereby enhancing the stability.

In this embodiment, as shown in FIG. 8A, a projecting portion 2j of the protective portion 2e are fitted to a groove 2k formed on a opposite surface to the housing 7 of the supporting portion 2a so that the protective portion 2e and the supporting portion 2a are integrated. As the protective portion 2e can be detached from the supporting portion 2a, the breathable film 4 can be replaced by new breathable film 4.

(Third Embodiment)

In this embodiment, the other ventilation member of the invention is described by accompanying FIGS. 9A to 11. Unless specific explanation is provided, this embodiment is configured similarly to the previous embodiment, like elements are given like reference numerals so that the explanations are omitted.

In the ventilation members described as the first and second embodiments, two or more leg portions 2h include the tapered lock portion 2c (See FIGS. 2B and 8B), none of the leg portions 2h of the ventilation member 31 in this embodiment includes lock portion. Outer diameter of the insertion portion 2b is nearly equal to the diameter of the opening portion 8 so that the ventilation member 31 is fixed to the housing 7 by press-fitting the insertion portion 2b into the opening portion 8.

Figure 10:
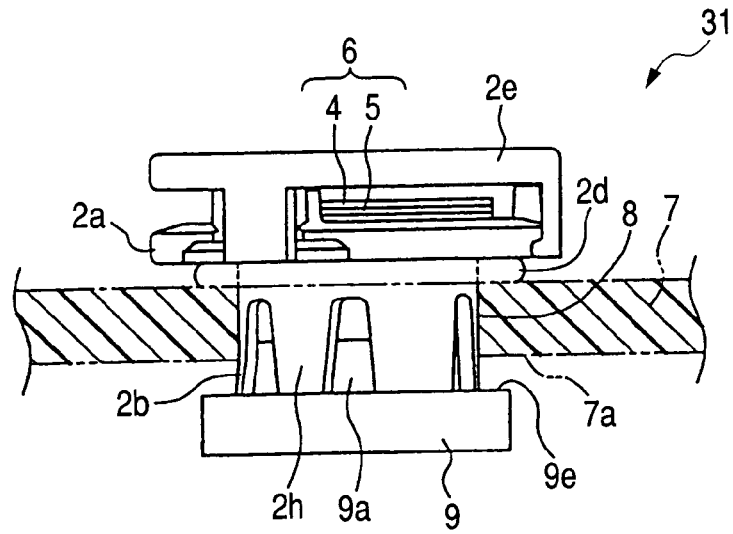
FIG. 10 is a front view showing a state in which the pull-out prevention member is mounted on the ventilation member shown in FIG. 9.

As shown in FIG. 10, it is preferable that a pull-out prevention member 9 is provided on an inside portion of the insertion portion 2b at the insertion stating side thereof, which is projected into the housing 7 so that the insertion start side of the insertion portion 2b is spread from the inside thereof. By a kit for forming the breathable structure comprising the ventilation member 31 and the pull-out prevention member 9, the ventilation member 31 can be fixed to the housing 7 more reliably.

Figure 11:
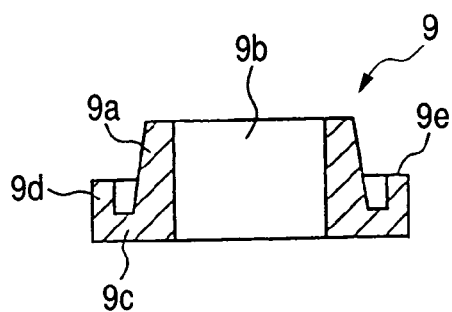
FIG. 11 is a sectional view showing the pull-out prevention member shown in FIG. 10.
Figure 12A:
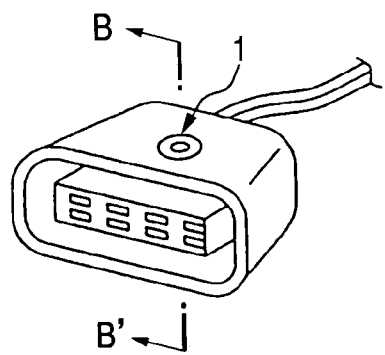
FIG. 12A is a perspective view of a connector to which a ventilation member according to the invention has been fixed.
Figure 12B:
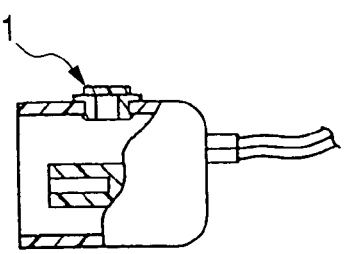
FIG. 12B is a sectional view taken on line B–B' in FIG. 12A.
Figure 13A:
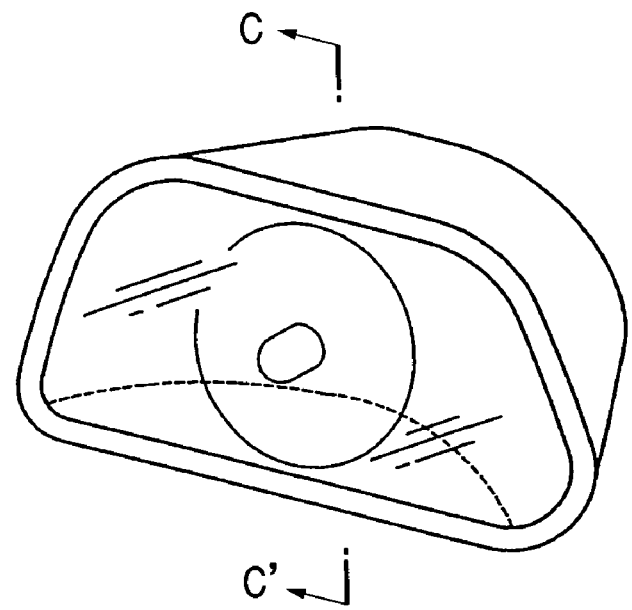
FIG. 13A is a perspective view of an automobile lamp to which a ventilation member according to the invention has been fixed.
Figure 13B:
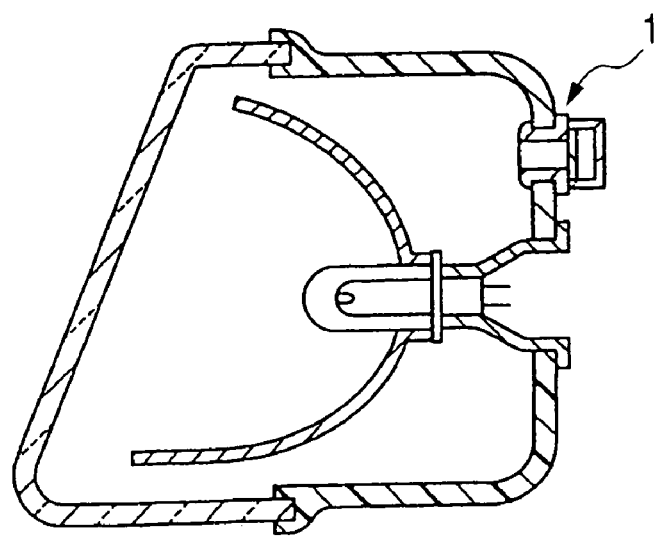
FIG. 13B is a sectional view taken on line C–C' in FIG. 13A.
Figure 14:
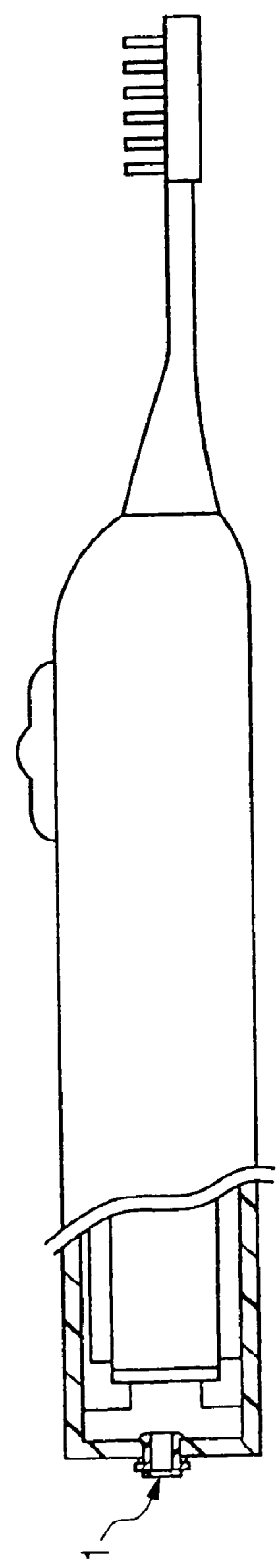
FIG. 14 is a partially sectional view of an electric toothbrush to which a ventilation member according to the invention has been fixed.
Figure 15A:
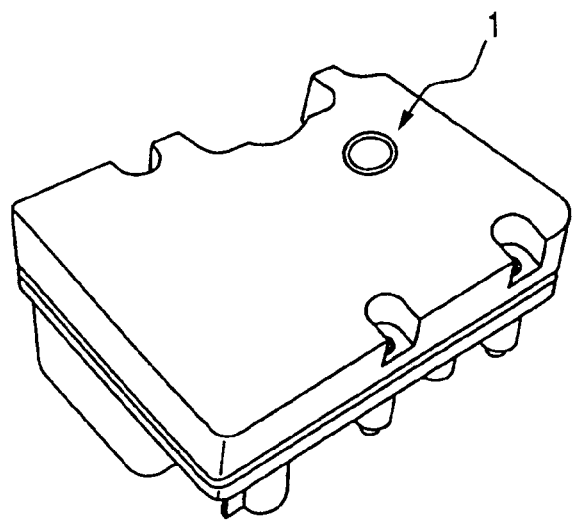
FIG. 15A is a perspective view of an ECU to which a ventilation member according to the invention has been fixed.
Figure 15B:
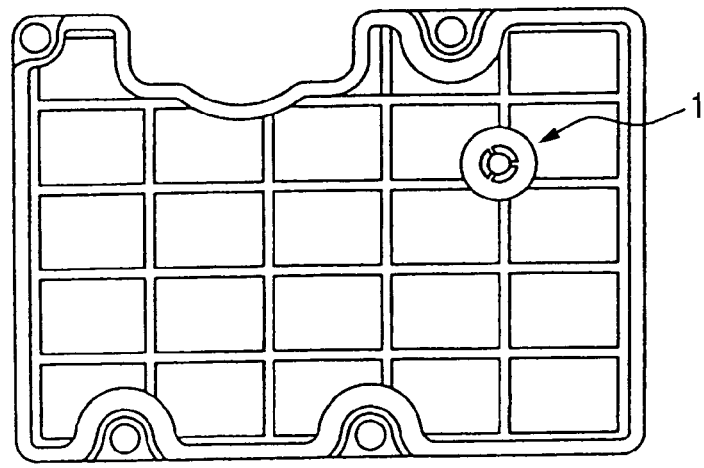
FIG. 15B is a back view of a top cover of an ECU cover.

As shown in FIGS. 10 and 11, the pull-out prevention member 9 includes a columnar portion 9a which is inserted into the insertion portion 2b inserted into the opening portion 8 so as to penetrate the opening portion 8, so that the insertion portion 2b is spread from the inside thereof. On the columnar portion 9a, an air hole 9b communicating with the through hole 3 of the ventilation member when the pull-out prevention member 9 is inserted into the insertion portion 2b is formed. Outer diameter of the columnar portion 9a becomes larger from an insertion stating side to an insertion end side of the columnar portion 9a. The pull-out prevention member 9 further includes a flange portion 9c provided on the insertion end side of the columnar portion 9a and having a larger outer diameter than the opening portion 8 of the housing 7 so that the pull-out prevention member 9 is prevented from being excessively inserted into the insertion portion 2b.

As shown in FIGS. 10 and 11, the pull-out prevention member 9 may further include a turn back portion 9d formed from the flange portion 9c so as to surround the columnar portion 9a. If the turn back portion 9d is formed so that the leg portions 2h are fitted between the turn back portion 9d and the columnar portion 9a, the pull-out prevention member 9 is mounted on the ventilation member 31 more reliably. Further, if the turn back portion 9d is formed so that an end face 9e of the turn back portion 9d abuts with a back surface 7a with respect to a surface of the housing 7 opposing the supporting portion 2a in a state that the columnar member 9a is inserted into the insertion portion 2b, the ventilation member 31 can be fixed to the housing 7 so that the insertion portion 2b does not slide within the opening portion 8. As the pull-out prevention member 9 can be removed in accordance with the necessity, the ventilation member can be replaced. Fitting grooves and fitting projections for fitting or external threads and internal threads for screwing or the like may be formed on the inside of the insertion portion 2b or the outside of the columnar portion 9a.

Material used for the pull-out prevention member 9 is not limited specifically. The material similar to that of the support may be used. Material having elasticity like a rubber such as thermoplastic elastomer may be used.

Next, FIGS. 12A, 12B, 13A, 13B, 14, 15A and 15B show examples of vented housings to which ventilation members according to the invention have been fixed respectively. The ventilation member 1 shown in FIG. 1 has been fixed to a connector shown in FIGS. 12A and 12B. The ventilation member 1 shown in FIGS. 6A and 6B has been fixed to an automobile lamp shown in FIGS. 13A and 13B. The ventilation member 1 shown in FIG. 5 has been fixed to an electric toothbrush shown in FIG. 14. The ventilation member 1 shown in FIG. 1 has been fixed to an ECU shown in FIGS. 15A and 15B. However, housings to which ventilation members according to the invention are fixed are not limited to these housings. In addition, the number of ventilation members according to the invention to be fixed to a housing is not limited particularly. A plurality of ventilation members may be attached to different sides of a housing or one and the same side of a housing.

EXAMPLES

Although the invention will be described below in further detail by use of its examples, the invention is not limited to the following examples.

Example 1

As Example 1, the ventilation member shown in FIGS. 6A and 6B was produced as follows.

First, the support 2 having a structure shown in FIGS. 6A and 6B was obtained by injection molding out of PBT (CG7640 made by Teijin Ltd., melting point 225° C.). The supporting portion 2a of the obtained support 2 was 2.5 mm in thickness and 16 mm in outer diameter, the insertion portion 2b of the obtained support 2 (where the lock portion 2c is not formed) was 5.5 mm in outer diameter, and the through holes 3 provided in the insertion portion 2b were 3.5 mm in inner diameter. The protection layer 2e was 3.5 mm in thickness, and, 16 mm in outer diameter.

Next, a PTFE porous material (Microtex NTF1131 made by Nitto Denko Corp., melting point 327° C.) 0.085 mm in thickness and 20 mm in outer diameter was prepared as the breathable film 4, and polyester-based nonwoven fabric (Axtar made by Toray Industries, Inc., melting point 230° C.) 0.2 mm in thickness was prepared as the reinforcement material 5. The breathable film 4 and the reinforcement material 5 were contact-bonded by heating deposition at a temperature of 260° C. and at a pressure of $5.0 \times 10^5$ Pa for 10 seconds. Thus, a laminate 6 was obtained.

Successively, the laminate 6 was punched out with an outer diameter of 8 mm. The reinforcement material 5 of the laminate 6 was brought into contact with the supporting portion 2a so as to cover the through holes 3 provided in the supporting portion 2a, and contact-bonded to the supporting portion 2a by heating deposition at a temperature of 260° C. and at a pressure of $5.0 \times 10^5$ Pa for 30 seconds. Next, the protective portion 2e and the supporting portion 2a were fixedly attached to each other by heating deposition. Finally, an O-ring made of EPDM as the seal portion 2d was outer-fitted to the insertion portion 2b. Thus, the ventilation member A was obtained.

On the other hand, a housing to which the ventilation member A was to be fixed was produced by injection molding out of PBT (CG7640 made by Teijin Ltd., melting point 225° C.). The outer wall of the obtained housing 7 was 2 mm in thickness, and the opening portion 8 was 6.5 mm in inner diameter. The ventilation member A was press-fitted to the opening portion 8 of the housing 7 by hand. Thus, a vented housing A was obtained.

Example 2

As Example 2, the ventilation member shown in FIGS. 6A and 6B was produced as follows.

First, the support 2 having a structure shown in FIGS. 6A and 6B was obtained by injection molding out of PP (AW564 made by Sumitomo Chemical Co., Ltd., melting point 165° C.). The supporting portion 2a of the obtained support 2 was 2.5 mm in thickness and 16 mm in outer diameter, the insertion portion 2b of the obtained support (where the lock portion 2c is not formed) was 5.5 mm in outer diameter, and the through holes 3 provided in the insertion portion 2b were 3.5 mm in inner diameter. The protective portion 2e was 3.5 mm in thickness and 16 mm in outer diameter.

Next, a PTFE porous material (Microtex NTF1026 made by Nitto Denko Corp., melting point 327° C.) 0.02 mm in thickness and 20 mm in outer diameter was prepared as the breathable film 4, and polyester-based nonwoven fabric (Axtar made by Toray Industries, Inc., melting point 230° C.) 0.2 mm in thickness was prepared as the reinforcement material 5. The breathable film 4 and the reinforcement material 5 were contact-bonded by heating deposition at a temperature of 260° C. and at a pressure of $5.0 \times 10^5$ Pa for 10 seconds. Thus, a laminate 6 was obtained.

Successively, the laminate 6 was punched out with an outer diameter of 8 mm. The reinforcement material 5 of the laminate 6 was brought into contact with the supporting portion 2a so as to cover the through holes 3 provided in the supporting portion 2a, and contact-bonded to the supporting portion 2a by heating deposition at a temperature of 260° C. and at a pressure of $5.0 \times 10^5$ Pa for 30 seconds. Next, the protective portion 2e and the supporting portion 2a were fixedly attached to each other by heating deposition. Finally, an O-ring made of NBR as the seal portion 2d was outer-fitted to the insertion portion 2b. Thus, the ventilation member B was obtained. The ventilation member B was press-fitted to the opening portion 8 of a housing 7 similar to that in Example 1 by hand. Thus, a vented housing B was obtained.

Example 3

As Example 3, the ventilation member shown in FIGS. 7, 8A and 8B was produced as follows.

First, the support 2 having a structure shown in FIGS. 7, 8A and 8B was obtained by injection molding out of PBT (CG7640 made by Teijin Ltd., melting point 225° C.). The supporting portion 2a of the obtained support 2 was 3 mm in thickness and 16.5 mm in maximum outer diameter, the insertion portion 2b of the obtained support (where the lock portion 2c is not formed) was 10 mm in outer diameter, and the through hole 3 provided in the insertion portion 2b was 8.5 mm in inner diameter, the dimension A was 4.25 mm and the dimension B was 2.1 mm. The protective portion 2e was 4.5 mm in thickness and 17 mm in outer diameter.

Successively, the laminate 6 which was fabricated as described in Example 2 was punched out with an outer diameter of 11 mm, and the laminate was bonded by fusion bonding to the supporting portion 2a in the same manner as Example 2. Next, the protective portion 2e and the supporting portion 2a were fixedly attached to each other by heating deposition. Finally, an O-ring made of EPDM as the seal portion 2d was outer-fitted to the insertion portion 2b. Thus, the ventilation member C was obtained.

On the other hand, the housing to which the ventilation member C is to be fixed was obtained by injection molding out of PBT (CG7640 made by Teijin Ltd., melting point 225° C.) . The outer wall of the obtained housing 7 was 2 mm in thickness. The opening portion 8 was 10.4 mm in inner diameter. The ventilation member C was press-fitted to the opening portion 8 of the housing 7 by hand. Thus, a vented housing C was obtained.

Example 4

As Example 4, the ventilation member shown in FIGS. 7, 8A and 8B was produced as follows.

First, the support 2 having a structure shown in FIGS. 7, 8A and 8B was obtained by injection molding out of PP (AW564 made by Sumitomo Chemical Co., Ltd., melting point 165° C.). The supporting portion 2a of the obtained support 2 was 3 mm in thickness and 16.5 mm in maximum outer diameter, the insertion portion 2b of the obtained support (where the lock portion 2c is not formed) was 10 mm in outer diameter, and the through hole 3 provided in the insertion portion 2b was 8.5 mm in inner diameter, the dimension A was 4.25 mm and the dimension B was 2.1 mm. The protective portion 2e was 4.5 mm in thickness and 17 mm in outer diameter.

Successively, the laminate 6 which was fabricated as described in Example 1 was punched out with an outer diameter of 11 mm, and the laminate was bonded by fusion bonding to the supporting portion 2a in the same manner as Example 1. Next, the protective portion 2e and the supporting portion 2a were fixedly attached to each other by heating deposition. Finally, an O-ring made of silicone rubber as the seal portion 2d was outer-fitted to the insertion portion 2b. Thus, a vented housing D was obtained.

Example 5

As Example 5, the ventilation member shown in FIG. 9 was produced as follows.

Figure 9A:
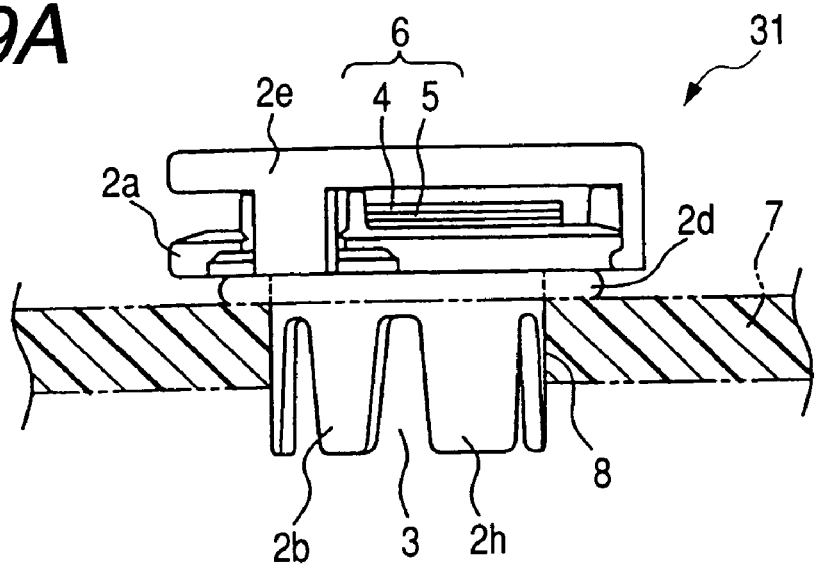
FIG. 9A is a front view of another embodiment of the ventilation member of the invention.
Figure 9B:
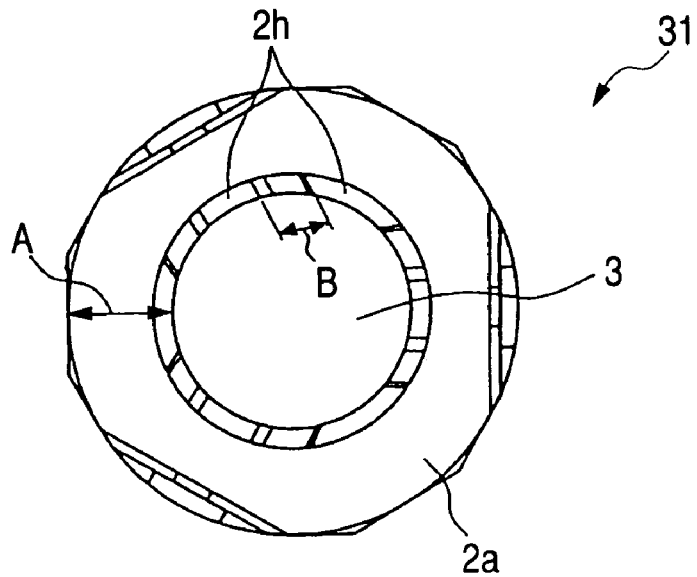

First, the support 2 having a structure shown in FIG. 9 was obtained by injection molding out of PBT (CG7640 made by Teijin Ltd., melting point 225° C.). The supporting portion 2a of the obtained support 2 was 3 mm in thickness and 16.5 mm in maximum outer diameter, the insertion portion 2b of the obtained support (where the lock portion 2c is not formed) was 10 mm in outer diameter, and the through hole 3 provided in the insertion portion 2b was 8.5 mm in inner diameter, the dimension A was 4.25 mm and the dimension B was 2.1 mm. The protective portion 2e was 4.5 mm in thickness and 17 mm in outer diameter.

Successively, the laminate 6 which was fabricated as described in Example 1 was punched out with an outer diameter of 11 mm, and the laminate was bonded by fusion bonding to the supporting portion 2a in the same manner as Example 1. Next, the protective portion 2e and the supporting portion 2a were fixedly attached to each other by heating deposition. Finally, an EPDM foamed sheet with adhesive layer (Seal-Saver, SA-612, made by Nitto Denko Corporation, thickness 4 mm), which was punched out in a torus-shape having an outer diameter of 15 mm and an inner diameter of 10.5 mm, was pasted on the surface opposing the housing of the supporting portion 2a. Thus, the ventilation member E was obtained.

Next, the pull-out prevention member 9 of the ventilation member having a structure shown in FIG. 11 was obtained by injection molding out of PBT (CG7640 made by Teijin Ltd., melting point 225° C.). The air hole 9b of the pull-out prevention member 9 was 4 mm in diameter, the columnar portion 9a was 8 mm in minimum outer diameter, and 9 mm in maximum outer diameter. The length of the columnar member 9a (which is defined as a length from a portion where the outer diameter is minimum to a portion where the outer diameter is maximum) was 4.0 mm.

The ventilation member E was inserted into the opening portion 8 of the housing 7 fabricated as described in Example 3, then the pull-out prevention member 9 was inserted into the insertion portion 2b which was inserted into the opening portion 8. Thus, a vented housing E was obtained.

Comparative Example 1

Figure 17A:
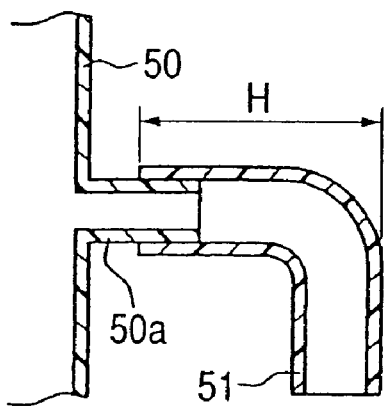
FIGS. 17A and 17B are sectional views showing an example of a related-art ventilation member.
Figure 17B:
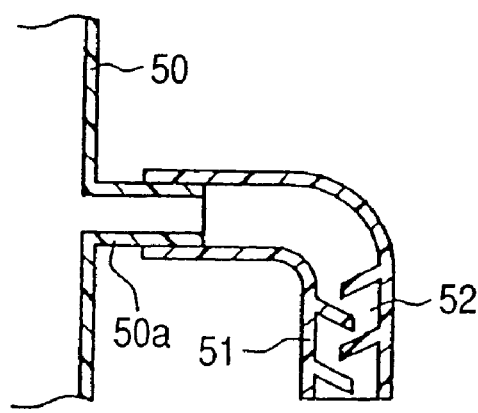

The ventilation member F shown in FIGS. 17A and 17B was produced by molding and hot curing out of a material having styrene-butadiene rubber (Tufdene 1000 made by Asahi-Kasei Corp., bending modulus $4.0\times10^8$ N/m$^2$) as its chief component. The obtained ventilation member F was 7.5 mm in inner diameter, 11.5 mm in outer diameter, 2 mm in thickness, and 40 mm in height H.

On the other hand, the housing 50 shown in FIGS. 17A and 17B was produced by injection molding as a housing to which the ventilation member F was to be fixed. The neck portion 50a was formed into a hollow columnar shape, whose outer diameter was larger by 20% than the inner diameter of the ventilation member F. One end of the ventilation member F was outer-fitted to the neck portion 50a for 8 mm. Thus, a vented housing was obtained.

Comparative Example 2

Figure 18A:
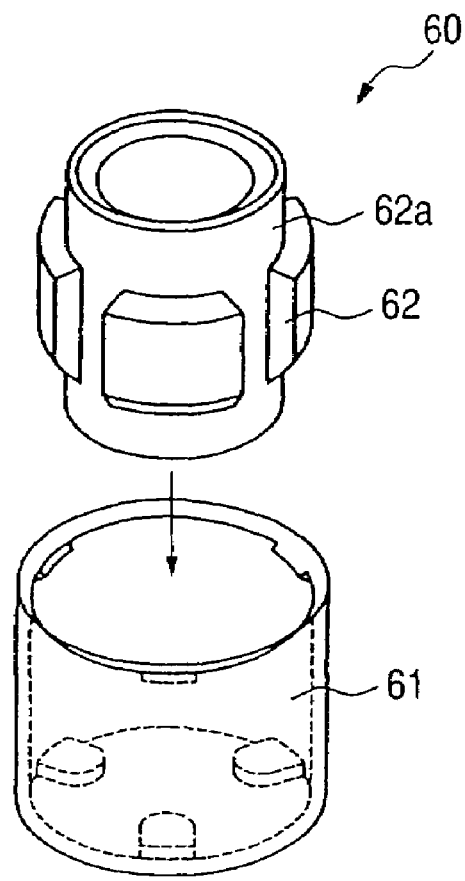
FIG. 18A is an exploded view for explaining another example of a related-art ventilation member.
Figure 18B:
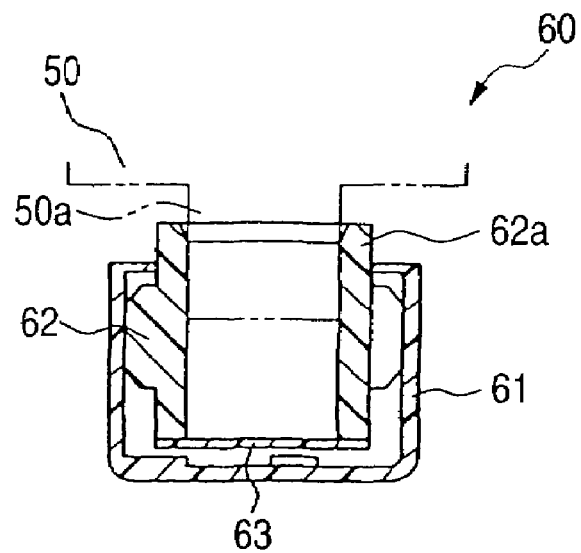
FIG. 18B is a sectional view of the ventilation member shown in FIG. 18A.
Figure 19:
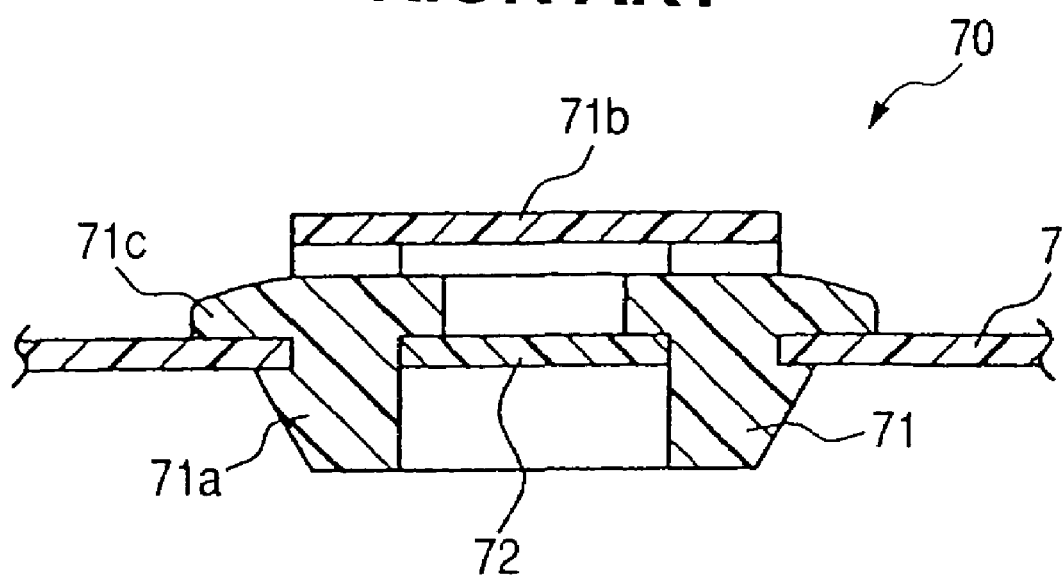
FIG. 19 is a sectional view for explaining another example of a related-art ventilation member.

The cover part 61 and the substantially cylindrical body 62 shown in FIGS. 18A and 18B were produced by injection molding out of PP (UBE Polypro J815HK made by Ube Industries, Ltd., bending modulus $1.47\times10^9$N/m$^2$) and out of thermoplastic elastomer (Milastomer 6030 made by Mitsui Chemicals Inc., bending modulus $4.41\times10^8$ N/m$^2$), respectively. The obtained cover part 61 was 17.5 mm in outer diameter and 15.5 mm in inner diameter, and the obtained substantially cylindrical body 62 was 15.5 mm in maximum outer diameter and 7.5 mm in inner diameter in the top portion opening portion 62a.

In addition, a PTFE porous material (Microtex NTF1026 made by Nitto Denko Corp., 0.02 $\mu$m in thickness, 0.6 $\mu$m in average pore size, and 80% in porosity) was prepared as the ventilation filter 63. Next, the ventilation filter 63 was brought into contact with the bottom portion of the obtained substantially cylindrical body 62, and then contact-bonded to the bottom portion of the obtained substantially cylindrical body 62 by heating deposition at a temperature of 150° C. and at a pressure of $10\times10^4$ Pa for 10 seconds. Then, the substantially cylindrical body 62 was fitted to the upper cover part 61. Thus, the ventilation member G was obtained.

On the other hand, the housing 50 shown in FIG. 18B was produced by injection molding as a housing to which the ventilation member G was to be fixed. The neck portion 50a was formed into a hollow columnar shape, whose outer diameter was larger by 20% than the inner diameter of the top portion opening portion 62a. The ventilation member G was outer-fitted to the neck portion 50a for 8 mm. Thus, a vented housing G was obtained.

Comparative Example 3

As Comparative Example 3, the ventilation member shown in FIG. 16 was produced as follows.

Figure 16A:
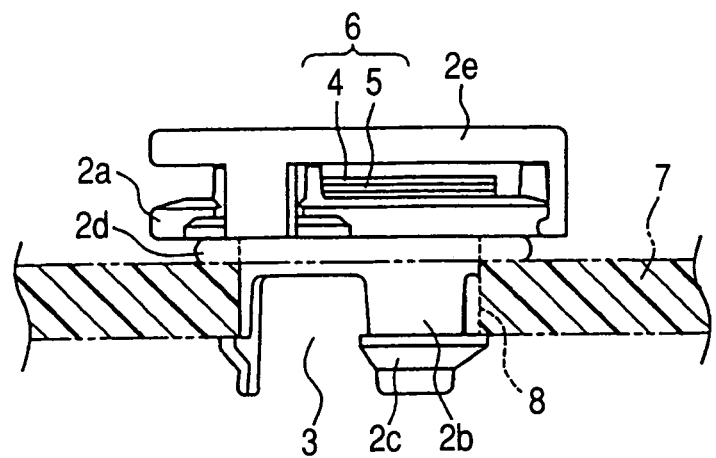
FIG. 16A is a front view of the ventilation member of Comparative Example 3.
Figure 16B:
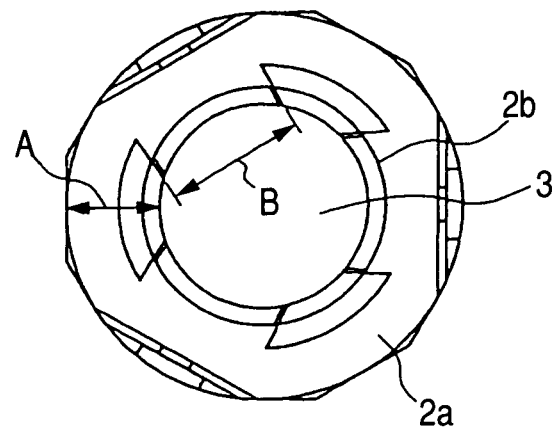
FIG. 16B is a view in which the seal portion is omitted from the bottom view of the ventilation member shown in FIG. 16A.

A structure shown in FIG. 16 was obtained by injection molding out of PBT (CG7640 made by Teijin Ltd., melting point 225° C.). The supporting portion 2a of the obtained support 2 was 3 mm in thickness and 16.5 mm in maximum outer diameter, the insertion portion 2b of the obtained support (where the lock portion 2c is not formed) was 10 mm in outer diameter, and the through hole 3 provided in the insertion portion 2b was 8.5 mm in inner diameter, the dimension A was 4.25 mm and the dimension B was 6.2 mm. The protective portion 2e was 4.5 mm in thickness and 17 mm in outer diameter.

Successively, the laminate 6 which was fabricated as described in Example 1 was punched out with an outer diameter of 11 mm, and the laminate was bonded by fusion bonding to the supporting portion 2a in the same manner as Example 1. Next, the protective portion 2e and the supporting portion 2a were fixedly attached to each other by heating deposition. Finally, an EPDM foamed sheet with adhesive layer (Seal-Saver, SA-612, made by Nitto Denko Corporation, thickness 4 mm), which was punched out in a torus-shape having an outer diameter of 15 mm and an inner diameter of 10.5 mm, was pasted on the surface opposing the housing of the supporting portion 2a. Thus, the ventilation member H was obtained. The ventilation member H was press-fitted to the opening portion 8 of the housing 7 fabricated as described in Example 3 by hand. Thus, a vented housing H was obtained.

Pull-out force was measured in the following method upon the vented housings obtained thus. As a result, the ventilation members A through E (Examples 1 through 5) and the ventilation member H (Comparative Example 3) could not be pulled out. The pull-out force of the ventilation member F (Comparative Example 1) was 7.5 N, and the pull-out force of the ventilation member G (Comparative Example 2) was 19.0 N.

In the "pull-out test", each ventilation member was pulled under the condition of a rate of pulling of $8.33 \times 10^{-4}$ m/s in the direction to pull the ventilation member out of the housing. Then, the maximum value at that time was regarded as pull-out force. Incidentally, when the pull-out force was not smaller than 30 N, it was judged to be impossible to pull out.

Further, for the ventilation members C through E (Examples 3 through 5) and the ventilation member H (Comparative Example 3), 100 pieces of each kind of ventilation members were contained respectively in a package of 1000 mm on a side, and the package was shaken in various directions for ten minutes. The interlacement of the leg portions $2h$ between the one and other ventilation members, and occurrence of the breathable film breakages were visually checked. As for the ventilation members C through E, interlacement among the leg portions $2h$ and breakage of the breathable films were not found. On the other hand, as for the ventilation members H, 20 pieces among 100 were found interlaced. Thus, it has been clarified that the interlacement of the leg portions as well as breakage of the breathable film 4 in one ventilation member by a leg portion of the other ventilation member can be inhibited by providing the dimension A larger than the dimension B.

As described above, according to the invention, a ventilation member in which the possibility that the ventilation member is pulled out of a housing has been reduced, and a vented housing using the ventilation member can be provided.

What is claimed is:

1. A ventilation member comprising:
   a breathable film transmitting gas passing through an opening portion of a housing in a state in which said breathable film is fixed to said opening portion; and
   a support including a supporting portion for supporting said breathable film and an insertion portion to be inserted into said opening portion of said housing;
   wherein said insertion portion is divided into a plurality of parts circumferentially at least on an insertion start side thereof;
   a reinforcement material bonded to said breathable film, so that said reinforcement material and said breathable film form a laminate; and
   wherein an air permeability of said laminate is in a range of 0.1–300 sec/100 cm$^3$ and said laminate has a water resistant pressure of not less than 1.0 kPa.

2. A ventilation member according to claim 1, wherein a through hole is formed in said support, and said breathable film is fixed to said supporting portion so as to cover said through hole.

3. A ventilation member according to claim 1, said insertion portion includes a plurality of leg portions at least on the insertion start side, and at least one of said leg portions is provided with a lock portion on the insertion start side thereof.

4. A ventilation member according to claim 3, wherein said leg portions include at least one leg portion which is not provided with said lock portion.

5. A ventilation member according to claim 3, wherein said support has a ring shape, a minimum ring width of said ring shape is larger than a distance defined between a pair of said leg portions at an end of the insertion start side of said insertion portion.

6. A ventilation member according to claim 1, wherein a plurality of through holes are formed in a surface of said support covered with said breathable film.

7. A ventilation member according to claim 1, wherein said support includes a seal portion on a surface of said supporting portion facing said housing.

8. A ventilation member according to claim 1, wherein said support includes a protective portion covering at least a part of said breathable film from above of said breathable film.

9. A ventilation member according to claim 1, wherein said breathable film includes a PTFE porous material.

10. A ventilation member according to claim 1, wherein said breathable film is subjected to liquid-repellent treatment.

11. A vented housing comprising a ventilation member according to claim 1, which is fixed to said opening portion of said housing.

12. A ventilation member according to claim 1, wherein said reinforcement material is bonded to at least one side of said breathable film.

* * * * *